United States Patent
Ko

(10) Patent No.: US 7,531,461 B2
(45) Date of Patent: May 12, 2009

(54) PROCESS AND SYSTEM FOR ETCHING DOPED SILICON USING $SF_6$-BASED CHEMISTRY

(75) Inventor: Akiteru Ko, Peabody, MA (US)

(73) Assignee: Tokyo Electron Limited (JP)

( * ) Notice: Subject to any disclaimer, the term of this patent is extended or adjusted under 35 U.S.C. 154(b) by 50 days.

(21) Appl. No.: 11/225,891

(22) Filed: Sep. 14, 2005

(65) Prior Publication Data

US 2007/0056926 A1   Mar. 15, 2007

(51) Int. Cl.
   H01L 21/302   (2006.01)
(52) U.S. Cl. ........................... 438/719; 438/706
(58) Field of Classification Search .............. 438/706, 438/710, 719, 766
   See application file for complete search history.

(56) References Cited

U.S. PATENT DOCUMENTS

| | | | |
|---|---|---|---|
| 5,888,337 A | 3/1999 | Saito | |
| 6,479,373 B2 * | 11/2002 | Dreybrodt et al. | 438/592 |
| 6,635,185 B2 * | 10/2003 | Demmin et al. | 216/64 |
| 6,660,127 B2 * | 12/2003 | Nallan et al. | 156/345.48 |
| 6,670,278 B2 * | 12/2003 | Li et al. | 438/710 |
| 6,815,366 B2 * | 11/2004 | Higuchi | 438/714 |
| 6,867,084 B1 | 3/2005 | Chiu et al. | |
| 6,921,723 B1 * | 7/2005 | Lee et al. | 438/710 |
| 2003/0190814 A1 | 10/2003 | Kumar et al. | |
| 2004/0018739 A1 | 1/2004 | Abooameri et al. | |
| 2004/0099634 A1 | 5/2004 | Sakima | |
| 2004/0248413 A1 | 12/2004 | Donohoe et al. | |
| 2005/0009358 A1 | 1/2005 | Choi et al. | |
| 2005/0095785 A1 | 5/2005 | Jeon et al. | |
| 2006/0088980 A1 | 4/2006 | Chen et al. | |

OTHER PUBLICATIONS

Coburn et al., "Some Chemical Aspects of the Fluorocarbon Plasma Etching of Silicon and Its Compounds", IBM Journal of Research and Development, vol. 23, No.1, Jan. 1979, pp. 33-41.
Jansen et al., "A Survey on the Reactive Ion Etching of Silicon in Microtechnology", J. Micromech. Microeng. 6, 1996, pp. 14-28.
Winters et al., "Influence of Doping on the Etching of Si(111)", Physical Review B, vol. 36, No. 12, Oct. 1987, pp. 6613-6622.
Int'l Search Report; Application No. US06/029278 mailed Nov. 26, 2007.
Written Opinion of the ISA; Application No. US06/029278 mailed Nov. 26, 2007.
International Preliminary Report on Patentability; Application No. PCT/US06/029278 mailed Mar. 27, 2008.
Internatioanl Search Report; Application No. US06/027654 mailed May 8, 2008.
Written Opinion of the ISA; Application No. US06/027654 mailed May 8, 2008.
Office Action in U.S. Appl. No. 11/225,893 mailed May 1, 2008.
Final Office Action issued in U.S. Appl. No. 11/225,893 mailed Oct. 15, 2008.

(Continued)

Primary Examiner—Kin-Chan Chen

(57) ABSTRACT

A process and system for anisoptropically dry etching through a doped silicon layer is described. The process chemistry comprises $SF_6$ and a fluorocarbon gas. For example, the fluorocarbon gas can include $C_xF_y$, where x and y are integers greater than or equal to unity, for example, $C_4F_8$.

16 Claims, 8 Drawing Sheets

OTHER PUBLICATIONS

Chinese Office Action issued in Application 200680033770.X mailed Jan. 9, 2009.

English Language Translation of Chinese Office Action issued in Application No. 200680033770.X mailed Jan. 9, 2009.

* cited by examiner

PROCESS AND SYSTEM FOR ETCHING DOPED SILICON USING SF$_6$-BASED CHEMISTRY

CROSS-REFERENCE TO RELATED APPLICATIONS

This application is related to co-pending U.S. application Ser. No. 11/225,893, entitled "Process and System For Etching Doped Silicon", filed on even date herewith. The entire contents of this application is herein incorporated by reference in its entirety.

FIELD OF THE INVENTION

The present invention relates to a method and system for etching a doped silicon layer on a substrate using a dry plasma process, and more particularly to a method and system for etching a doped silicon layer using a process gas comprising SF$_6$ and a fluorocarbon gas.

BACKGROUND OF THE INVENTION

As is known to those in the semiconductor art, the reduction in size of semiconductor devices has been indispensably necessary in order to cause an increase in device performance and a decrease in power consumption. For instance, in keeping with the pace of modern technology, integrated circuits (ICs), including, for example, field-effect transistors (FETs), are now formed with gate lengths less than 50 nm. However, as gate lengths are formed below 50 nm, FET scaling becomes limited by the configuration of these devices, including the methods by which they are fabricated. For example, as VLSI technology approaches the limits in scaling, there currently exist several device structures under consideration, namely, a bulk MOSFET (metal-oxide-semiconductor FET), a dual-gate MOSFET, and a SOI (silicon-on-insulator) MOSFET. During the fabrication of advanced semiconductor devices, silicon layers are etched while critical dimensions of the feature formed therein are maintained. Often times, this requires the etching of a shallow doped silicon region, followed by the etching of an un-doped silicon region, each of which having an optimal process chemistry to facilitate preservation of the feature critical dimension.

SUMMARY OF THE INVENTION

The present invention relates to a method and system for etching a doped silicon layer on a substrate. The method comprises using a process composition having SF$_6$ and a fluorocarbon gas.

Additionally, the present invention relates to a method and system for etching a silicon layer, wherein the silicon layer comprises a doped silicon sub-layer that extends through a portion of the thickness of the silicon layer. The method comprises etching the doped silicon sub-layer using a first process composition, and optionally etching the remaining un-doped silicon layer using a second process composition. The first process composition comprises SF$_6$ and a fluorocarbon gas.

According to an embodiment, a method of etching a silicon layer on a substrate is described, wherein the substrate having the silicon layer including a dopant is disposed in a plasma processing system. A process composition comprising SF$_6$ and a fluorocarbon gas is introduced to the plasma processing system. A plasma is formed from the process composition in the plasma processing system. The substrate is exposed to the plasma in order to etch the silicon layer. Furthermore, according to another embodiment, a computer readable medium is employed which includes a program for performing the method.

According to yet another embodiment, a plasma processing system for etching a silicon layer on a substrate is described, including a plasma processing chamber for facilitating the formation of a plasma from a process composition in order to etch the silicon layer, wherein the silicon layer comprises a dopant. A controller, coupled to said plasma processing chamber, is configured to execute a process recipe utilizing the process composition. The process composition comprises SF$_6$ and a fluorocarbon gas.

DETAILED DESCRIPTION OF SEVERAL EMBODIMENTS

In material processing methodologies, pattern etching comprises the application of a thin layer of light-sensitive material, such as photoresist, to an upper surface of a substrate that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Figure 1A:
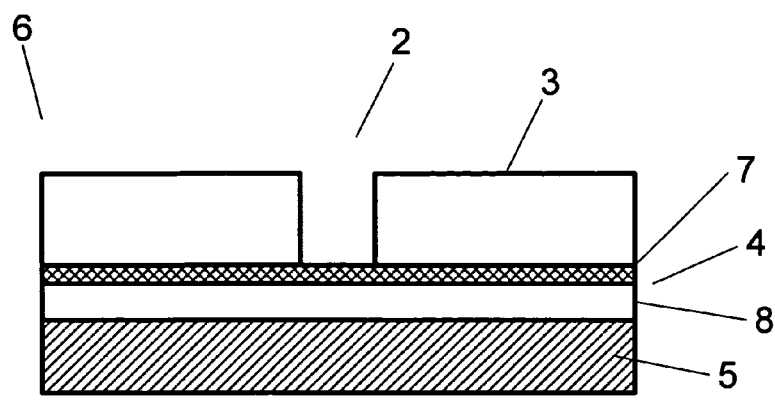
FIGS. 1A, 1B, and 1C show a schematic representation of a typical procedure for pattern etching a thin film.
Figure 1B:
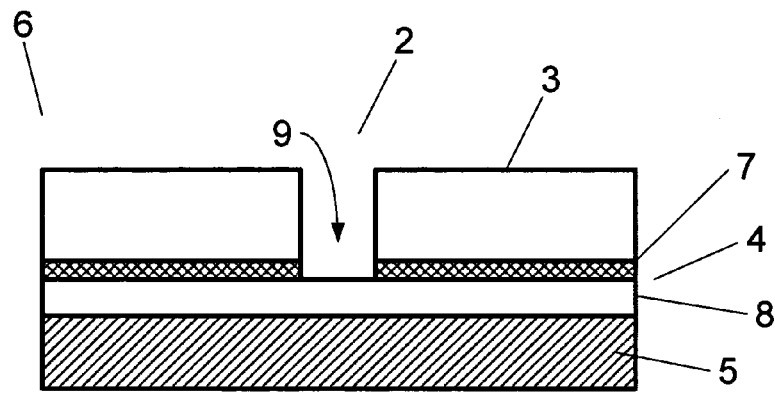
Figure 1C:
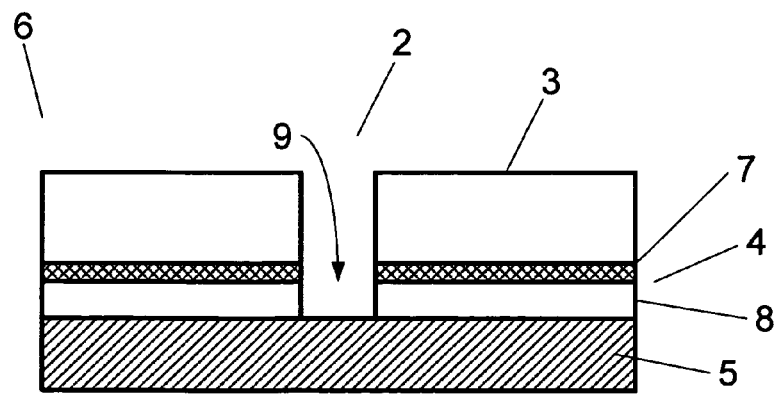

For example, as shown in FIGS. 1A-C, an etching mask 6 comprising light-sensitive layer 3 with pattern 2 formed using conventional lithographic techniques can be utilized as a mask for etching a silicon layer 4, wherein the mask pattern 2 in the light-sensitive layer 3 is transferred to the silicon layer 4 using an etching process. The etching mask 6 may further comprise multiple layers, such as an anti-reflective coating (ARC) underlying the light-sensitive layer 3. The pattern 2 in light-sensitive layer 3 can be transferred to the underlying ARC via an etching process.

The silicon layer 4 comprises doped silicon sub-layer 7 that extends through a portion of the thickness of the silicon layer 4. In the etching process for transferring the pattern 2 into silicon layer 4, the doped silicon sub-layer 7 s etched using a first process composition. The dopant concentration in the silicon sub-layer can range from substantially no dopant to the maximum concentration attainable for the dopant in silicon. For example, the dopant may be phosphorus and the dopant concentration may range from approximately no phosphorus dopant to the maximum concentration of approximately 5E+21 atoms per cubic centimeter, or alternatively, the concentration may range from approximately 1E+20 atoms per cubic centimeter to approximately 4E+20 atoms per cubic centimeter. The first process composition may be utilized to etch the remaining un-doped silicon sub-layer 8. Optionally, the remaining un-doped silicon sub-layer 8 is etched using a second process composition.

Underlying the silicon layer 4, an etch stop layer (not shown) may be employed to facilitate the end of the etching process while preventing the etching process from penetrating the underlying layers of substrate 5. For example, the etch stop layer can include silicon nitride or silicon carbide for silicon processing. Additionally, a dielectric layer (not shown) may underlie the silicon layer 4. For instance, the dielectric layer can include an oxide layer, such as a silicon dioxide ($SiO_2$) layer, a high dielectric constant (high-k) dielectric layer, an oxynitride layer, such as a silicon oxynitride layer, etc. Once the etching process is performed, remnants of the light-sensitive material and post-etch residue 8 are left on surfaces of feature 9. For example, remnants of the light-sensitive material and post-etch residue may be found on the flat field (or upper surface of the substrate), the sidewalls of feature 9, or the bottom of feature 9.

To transfer pattern 2 into silicon layer 4 according to an embodiment, the doped silicon sub-layer 7 is etched by introducing a first process composition comprising $SF_6$ and a fluorocarbon gas, and thereafter forming plasma. The fluorocarbon gas may be represented as $C_xF_y$, where x and y are integers greater than or equal to unity. For example, the fluorocarbon gas can include any one or a combination of two or more of $C_4F_8$, $C_5F_8$, $C_3F_6$, $C_4F_6$, etc. Alternatively, the fluorocarbon gas may be represented as $CH_xF_y$, where x and y are integers greater than or equal to unity. For example, the fluorocarbon gas can include $CHF_3$ and/or $CH_2F_2$, or the like. Additionally, the first process composition can include an inert gas, such as a noble gas (e.g., He, Ne, Ar, Kr, Xe). The remaining un-doped silicon sub-layer 8 can be etched by introducing a second process composition comprising a halogen containing compound. For example, the halogen containing compound can include HBr, $Cl_2$, or $SF_6$ or any combination thereof. Additionally, the second process composition can include an inert gas, such as a noble gas (e.g., He, Ne, Ar, Kr, Xe). Additionally, the process composition can include an oxygen containing compound, such as $O_2$, CO, or $CO_2$, or any combination of two or more thereof or the like. Although the process recipe is presented as a two step process, it may include a single step utilizing the first process composition to etch both the doped silicon sub-layer 7 and the un-doped silicon sub-layer 8.

Figure 2:
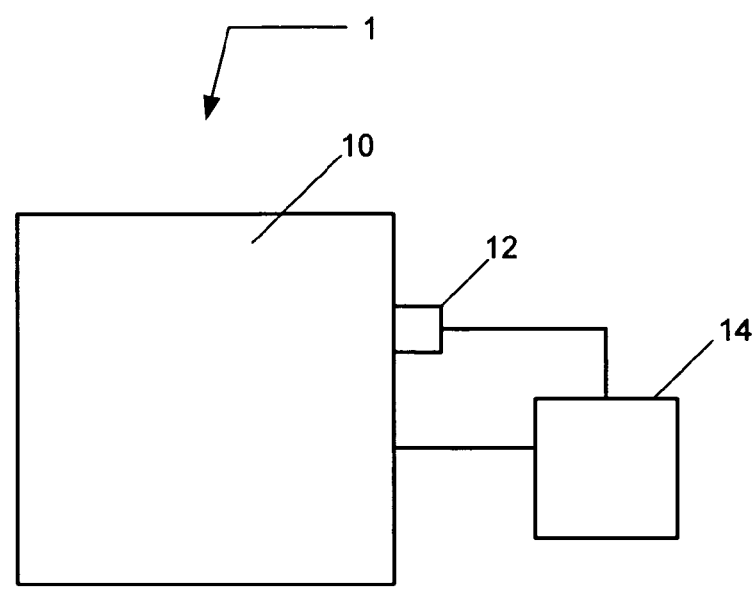
FIG. 2 shows a simplified schematic diagram of a plasma processing system according to an embodiment of the present invention.

According to one embodiment, a plasma processing system 1 is depicted in FIG. 2 comprising a plasma processing chamber 10, an optional diagnostic system 12 coupled to the plasma processing chamber 10, and a controller 14 coupled to the optional diagnostic system 12 and the plasma processing chamber 10. The controller 14 is configured to execute a process recipe comprising etching a doped silicon layer using a first process composition, and optionally also etching an underlying un-doped silicon layer using a second process composition. Additionally, controller 14 is optionally configured to receive at least one endpoint signal from the diagnostic system 12 and to post-process the at least one endpoint signal in order to accurately determine an endpoint for the process, the first part of the process, the optional second part of the process, or any combination thereof. Alternatively, controller 14 utilizes a pre-determined time to set the endpoint of the process, the first part of the process, the optional second part of the process, or any combination thereof. In the illustrated embodiment, plasma processing system 1, depicted in FIG. 2, utilizes a plasma for material processing. Plasma processing system 1 can comprise an etch chamber.

Figure 3:
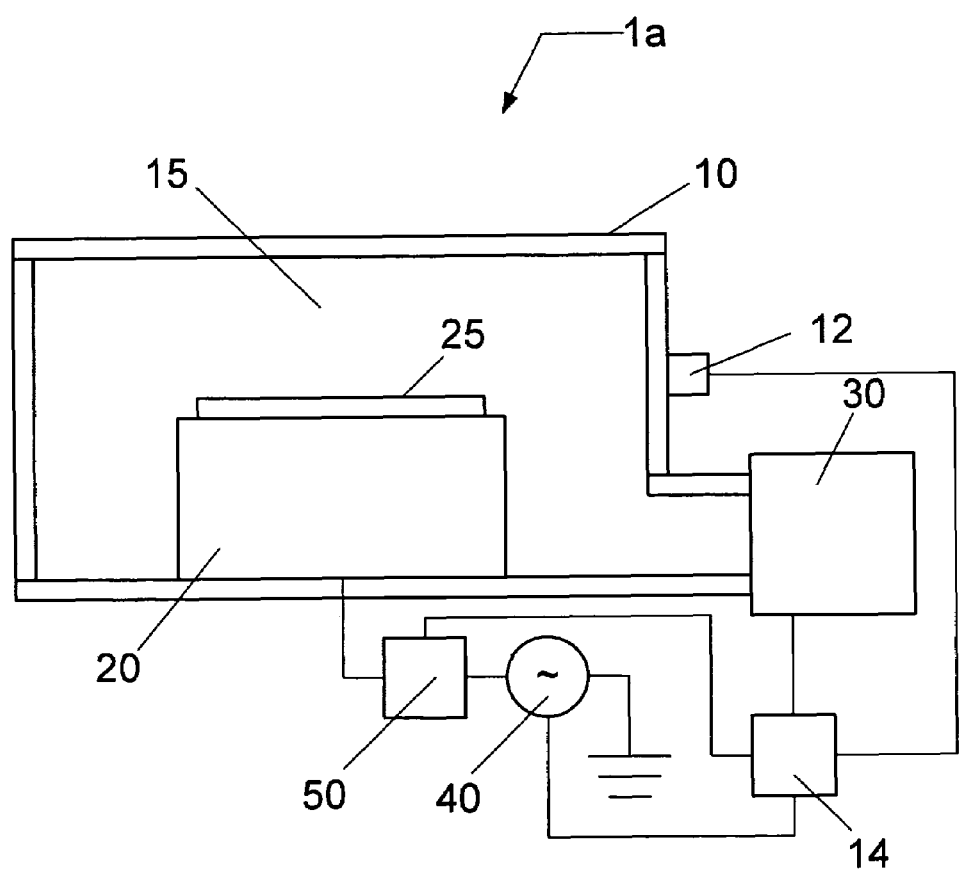
FIG. 3 shows a schematic diagram of a plasma processing system according to another embodiment of the present invention.

According to the embodiment depicted in FIG. 3, plasma processing system 1a can comprise plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process substrates of any size, such as 200 mm substrates, 300 mm substrates, or larger.

Substrate 25 can be affixed to the substrate holder 20 via an electrostatic clamping system. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, □-type, T-type, etc.) and automatic control methods are well known to those skilled in the art.

Vacuum pump system 30 can, for example, include a turbomolecular vacuum pump (TMP) capable of a pumping speed of 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.)

Controller 14 comprises a microprocessor, memory, and a digital I/O port capable of generating control voltages sufficient to communicate with and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system 1a according to a process recipe in order to perform the method of etching a doped silicon layer. One example of controller 14 is a DELL PRECISION WORKSTATION 610™, available from Dell Corporation, Austin, Tex.

Controller 14 may be locally located relative to the plasma processing system 1a, or it may be remotely located relative to the plasma processing system 1a via an internet or intranet. Thus, controller 14 can exchange data with the plasma processing system 1a using either a direct connection, an intranet, or the internet, or any combination thereof. Controller 14 may be coupled to an intranet at a customer site (i.e., a device maker, etc.), or coupled to an intranet at a vendor site (i.e., an equipment manufacturer). Furthermore, another computer (i.e., controller, server, etc.) can access controller 14 to exchange data via either a direct connection, an intranet, or the internet, or any combination thereof.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include a line CCD (charge coupled device), a CID (charge injection device) array, or a light dispersing device such as a grating or a prism, or any combination thereof. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single or bundled optical fibers, where the light output from the optical fibers is dispersed across the line CCD array using a fixed grating. With the configuration described above, light transmitted through an optical vacuum window can be focused onto the input end of the optical fibers via a convex spherical lens. Three spectrometers, each specifically tuned for a given spectral range (UV, VIS and NIR), form a sensor for the process chamber 10. Each spectrometer includes an independent A/D converter. And lastly, depending upon the sensor utilization, a full emission spectrum can be recorded every 0.1 to 1.0 seconds.

Alternatively, the diagnostic system 12 can include a Model SE3000 spectroscopic ellipsometer, commercially available from SOPRA.

Figure 4:
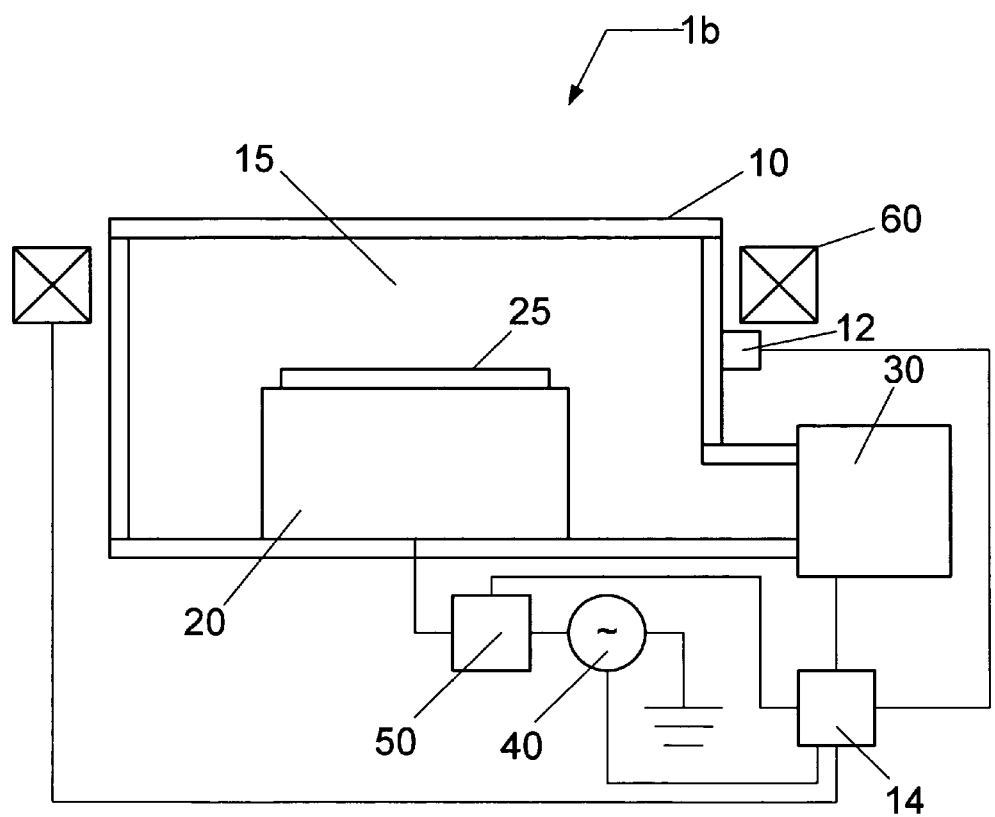
FIG. 4 shows a schematic diagram of a plasma processing system according to another embodiment of the present invention.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2 and FIG. 3. Moreover, controller 14 can be coupled to magnetic field system 60 in order to regulate the speed of rotation and field strength. The design and implementation of a rotating magnetic field is well known to those skilled in the art.

Figure 5:
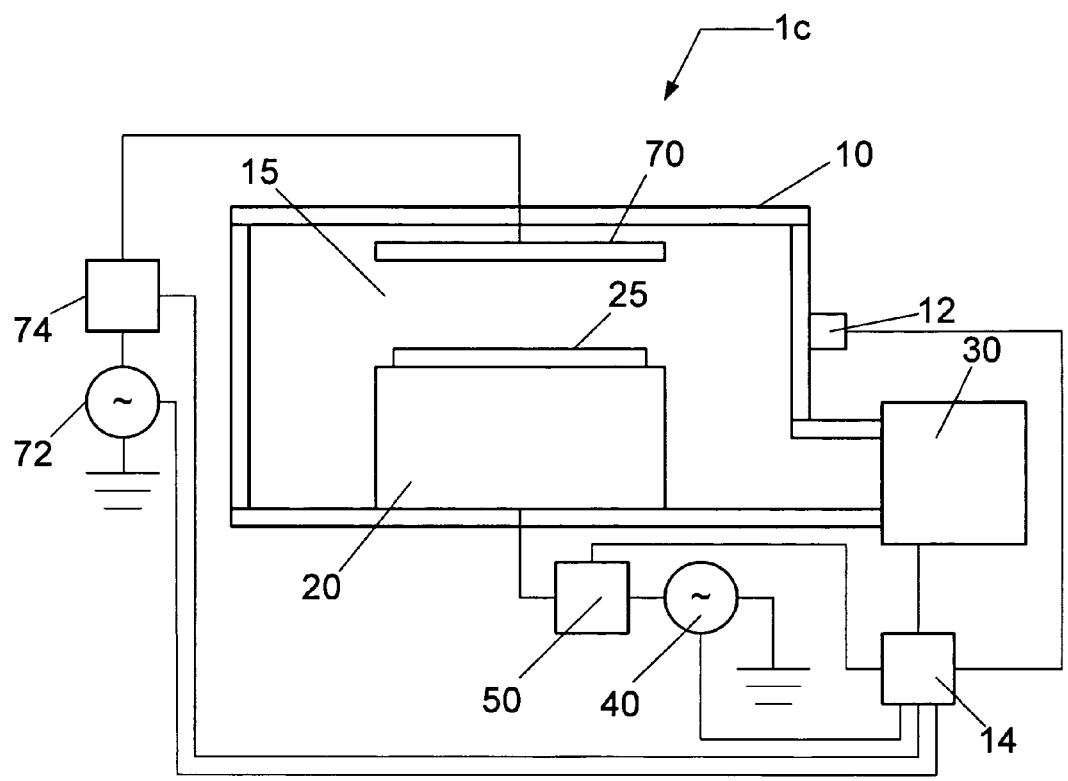
FIG. 5 shows a schematic diagram of a plasma processing system according to another embodiment of the present invention.

In the embodiment shown in FIG. 5, the plasma processing system 1c can be similar to the embodiment of FIG. 2 or FIG. 3, and can further comprise an upper electrode 70 to which RF power can be coupled from RF generator 72 through impedance match network 74. A typical frequency for the application of RF power to the upper electrode can range from about 0.1 MHz to about 200 MHz. Additionally, a typical frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
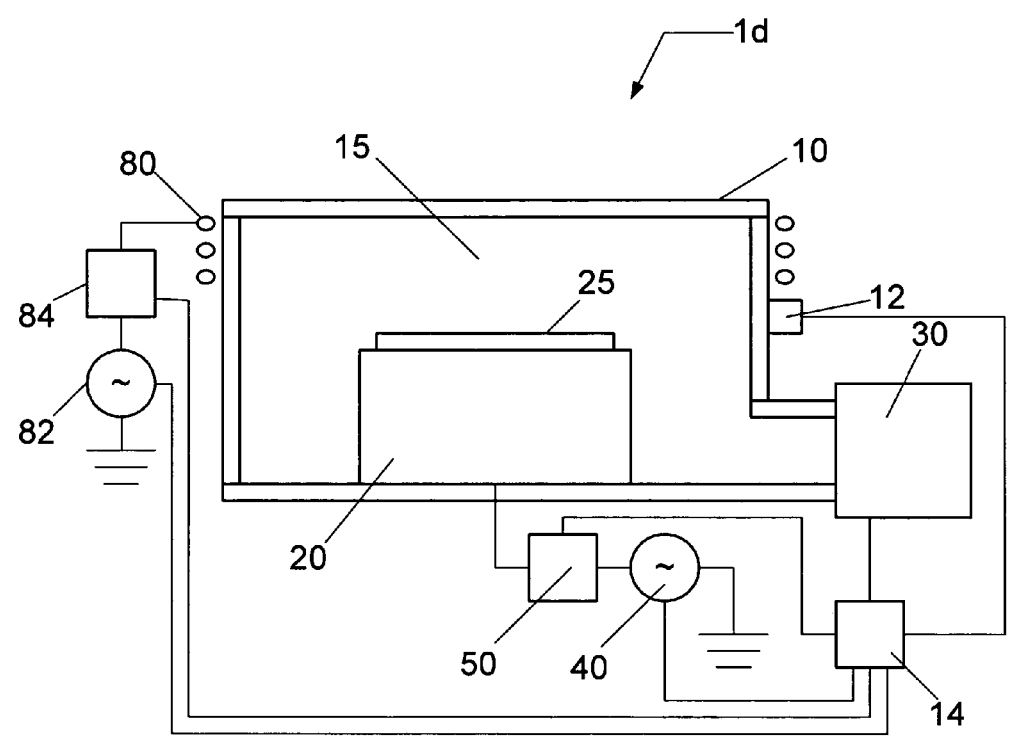
FIG. 6 shows a schematic diagram of a plasma processing system according to another embodiment of the present invention.

In the embodiment shown in FIG. 6, the plasma processing system 1d can be similar to the embodiments of FIGS. 2 and 3, and can further comprise an inductive coil 80 to which RF power is coupled via RF generator 82 through impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of etching a silicon layer having a doped silicon sub-layer utilizing a plasma processing device is presented. The plasma processing device can comprise various elements, such as described with respect to FIGS. 2 through 6, or combinations thereof.

In one embodiment, a method of etching a doped silicon layer, such as a phosphorus doped layer, employs a process composition comprising $SF_6$ and a fluorocarbon gas, such as $CH_2F_2$, $CHF_3$, or $C_4F_8$, or the like. For example, a process parameter space can comprise a chamber pressure of about 5 to about 1000 mTorr, an $SF_6$ process gas flow rate ranging from about 10 to about 500 sccm, a $C_4F_8$ process gas flow rate ranging from about 10 to about 500 sccm, an upper electrode (e.g., element 70 in FIG. 5) RF bias ranging from about 10 to about 2000 W, and a lower electrode (e.g., element 20 in FIG. 5) RF bias ranging from about 10 to about 1000 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In one example, a method of etching a doped silicon sub-layer utilizing a plasma processing device such as the one described in FIG. 5 is presented. However, the methods discussed are not to be limited in scope by this exemplary presentation. Table 1 presents the etch rate of amorphous silicon (a-Si) (nanometers/minute, nm/min) and the etch selectivity for a-Si to (KrF) photoresist (PR) (ratio of etch rate of a-Si to etch rate of PR) for two exemplary process recipes. The first exemplary process recipe includes: Chamber pressure=about 10 mTorr; Upper electrode RF power=about 100 W; Lower electrode RF power=about 100 W; Process gas flow rate $SF_6/C_4F_8$=about 50/50 sccm; an electrode spacing of about 140 mm between the lower surface of electrode 70 (see FIG. 5) and the upper surface of substrate 25 on substrate holder 20; Lower electrode temperature (e.g., substrate holder 20 in FIG. 5)=about 75° C.; Upper electrode temperature (e.g., electrode 70 in FIG. 5)=about 80° C.; Chamber wall temperature=about 60° C.; Backside helium pressure Center/Edge=about 3/3 Torr; and an etch time of about 30 seconds. The second exemplary process recipe includes: Chamber pressure=about 20 mTorr; Upper electrode RF power=about 100 W; Lower electrode RF power=about 60 W; Process gas flow rate $CF_4/C_4F_8/N_2$=about 50/12/50 sccm; an electrode spacing of about 140 mm between the lower surface of electrode 70 (see FIG. 5) and the upper surface of substrate 25 on substrate holder 20; Lower electrode temperature (e.g., substrate holder 20 in FIG. 5)=about 75° C.; Upper electrode temperature (e.g., electrode 70 in FIG. 5)=about 80° C.; Chamber wall temperature=about 60° C.; Backside helium pressure Center/Edge=about 3/3 Torr; and an etch time of about 30 seconds. As shown in Table 1, the etch rate and the etch selectivity of a-Si to PR are increased for the $SF_6/C_4F_8$ chemistry.

TABLE 1

| Chemistry | Etch rate (nm/min) | Etch selectivity |
|---|---|---|
| $SF_6/C_4F_8$ | 97 | 1.7 |
| $CF_4/C_4F_8/N_2$ | 55 | 0.7 |

Figure 7A:
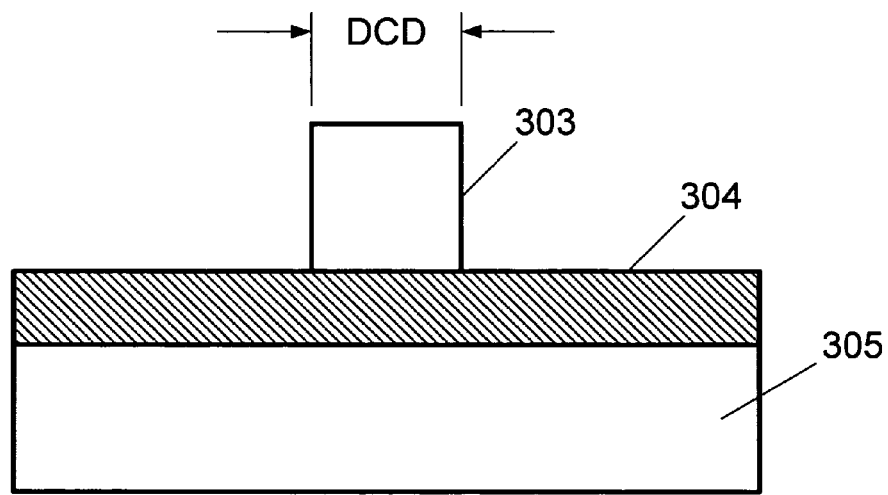
FIGS. 7A and 7B illustrate an exemplary structure before and after an etching process.
Figure 7B:
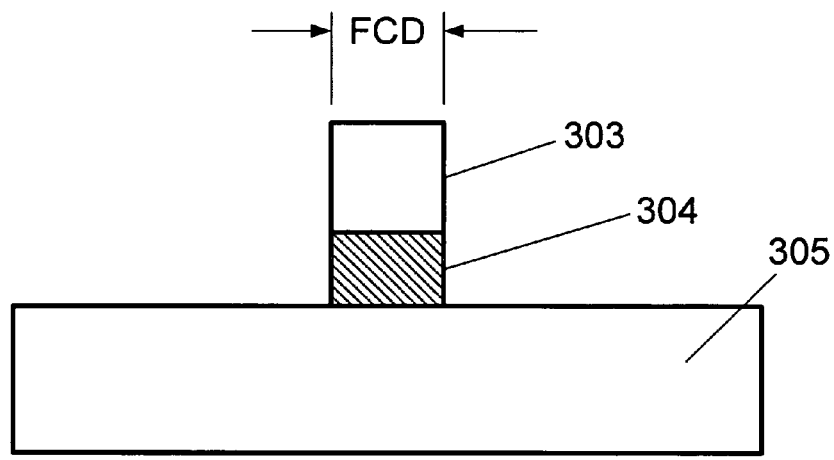

In another example, a method of etching a doped silicon sub-layer utilizing a plasma processing device such as the one described in FIG. 5 is presented. However, the methods discussed are not to be limited in scope by this exemplary presentation. Table 2 presents a summary of critical dimensions (CDs) for two process recipes on three different structures. Referring to FIGS. 7A and 7B, a substrate 305, a doped silicon layer 304 and a mask layer 303 are illustrated, wherein a structure having an initial critical dimension (DCD) is formed in the doped silicon layer 304 having a final critical dimension (FCD). Table 2 provides the initial and final CD (DCD and FCD, respectively) for the two process recipes. Additionally, Table 2 provides the CD variation for both DCD and FCD (in parenthesis) on substrate 305 for the process recipe and structure, and the trim amount (difference between DCD and FCD, i.e., DCD-FCD). Furthermore, Table 2 provides the offset in the trim amount between isolated structures (closely spaced features, ISO) and nested features (widely spaced features, NEST). The data are shown for p-doped silicon having a target FCD of 60 nm (60 nm structure) and a target FCD of 80 nm (80 nm structure), as well as n-doped polysilicon (Nfet, Poly-Si structure) and p-doped polysilicon (Pfet, Poly-Si structure).

The first exemplary process recipe includes: Chamber pressure=about 10 mTorr; Upper electrode RF power=about 100 W; Lower electrode RF power=about 200 W; Process gas flow rate $SF_6/C_4F_8$=about 60/40 sccm; an electrode spacing of about 140 mm between the lower surface of electrode 70 (see FIG. 5) and the upper surface of substrate 25 on substrate holder 20; Lower electrode temperature (e.g., substrate holder 20 in FIG. 5)=about 75° C.; Upper electrode temperature (e.g., electrode 70 in FIG. 5)=about 80° C.; Chamber wall temperature=about 60° C.; Backside helium pressure Center/Edge=about 3/30 Torr; and an etch time of about 30 seconds. The second exemplary process recipe includes: Chamber pressure=about 20 mTorr; Upper electrode RF power=about 100 W; Lower electrode RF power=about 60 W; Process gas flow rate $CF_4/C_4F_8/N_2$=about 50/12/50 sccm; an electrode spacing of about 140 mm between the lower surface of electrode 70 (see FIG. 5) and the upper surface of substrate 25 on substrate holder 20; Lower electrode temperature (e.g., substrate holder 20 in FIG. 5)=about 75° C.; Upper electrode temperature (e.g., electrode 70 in FIG. 5)=about 80° C.; Chamber wall temperature=about 60° C.; Backside helium pressure Center/Edge=about 3/3 Torr; and an etch time of about 30 seconds.

TABLE 2

| | 60 nm STRUCTURE | | 80 nm STRUCTURE | | Poly-Si STRUCTURE | |
|---|---|---|---|---|---|---|
| | ISO | NEST (200P) | ISO | NEST (300P) | Nfet | Pfet |
| $CF_4/C_4F_8/N_2$ | | | | | | |
| DCD | 84.6 (9.9) | 87.2 (11.1) | 106.6 (12.7) | 106.1 (9.7) | 90.6 (9.7) | 91.0 (10.0) |
| FCD | 66.1 (10.1) | 58.3 (10.5) | 84.9 (11.0) | 77.1 (10.1) | 62.1 (10.8) | 62.7 (11.1) |
| Trim | 18.5 | 28.9 | 21.7 | 29 | 28.5 | 28.3 |
| Offset | | 10.4 | | 7.3 | | 0.2 |

TABLE 2-continued

| | 60 nm STRUCTURE | | 80 nm STRUCTURE | | Poly-Si STRUCTURE | |
|---|---|---|---|---|---|---|
| | ISO | NEST (200P) | ISO | NEST (300P) | Nfet | Pfet |
| $SF_6/C_4F_8$ | | | | | | |
| DCD | 85.7 (12.5) | 85.9 (12.8) | 104.9 (14.8) | 101.4 (12.1) | 92.0 (10.7) | 92.1 (10.8) |
| FCD | 72.6 (9.5) | 74.2 (11.4) | 91.1 (10.9) | 87.9 (11.0) | 71.5 (10.0) | 71.7 (9.4) |
| Trim | 13.1 | 11.7 | 13.8 | 13.5 | 20.5 | 20.4 |
| Offset | | 1.4 | | 0.3 | | 0.1 |

As shown in Table 2, the offset in trim amount between isolated structures and nested structures is reduced when using the $SF_6/C_4F_8$ chemistry. With either chemistry, the offset can be approximately 10% of the DCD or less.

Figure 8:
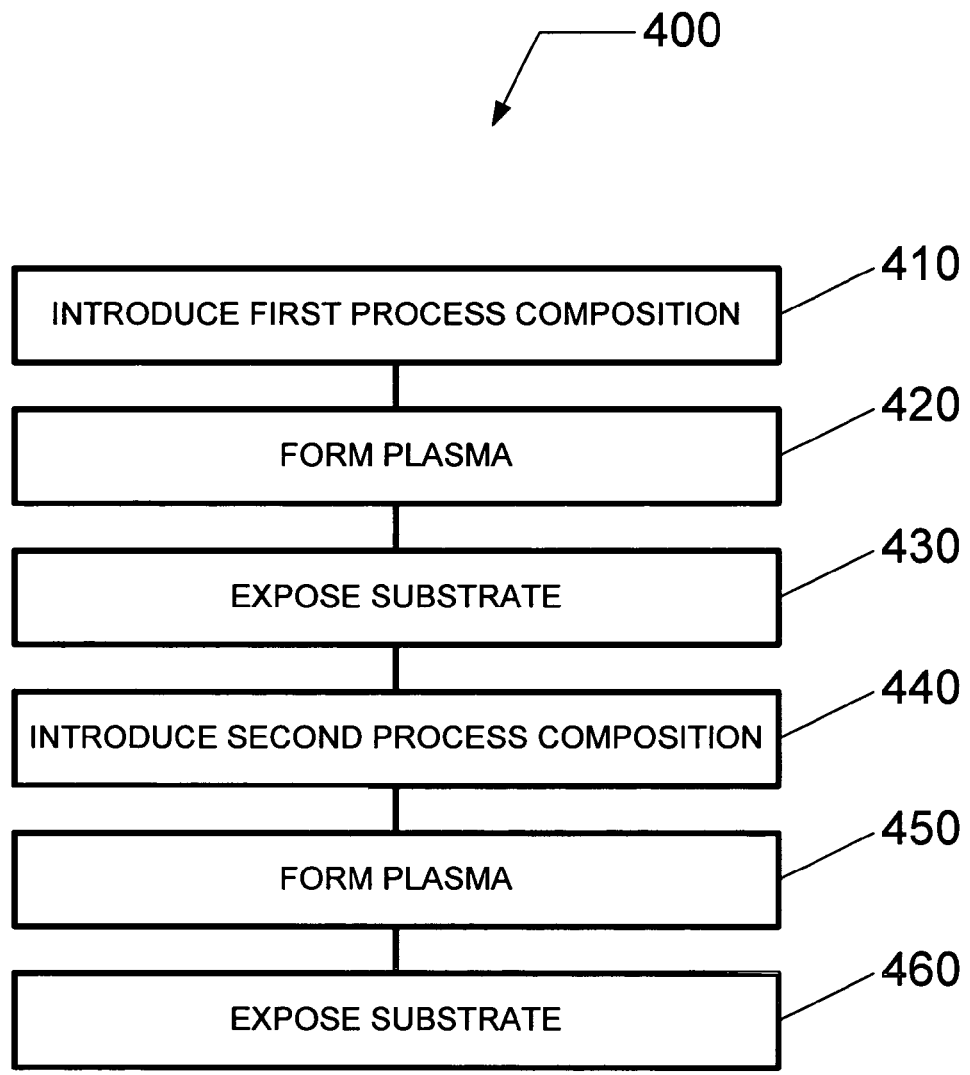
FIG. 8 presents a method of etching a doped silicon layer on a substrate in a plasma processing system according to an embodiment of the present invention.

FIG. 8 presents a flow chart of a method of etching a doped silicon layer on a substrate in a plasma processing system according to an embodiment of the present invention. Procedure 400 begins in 410 in which a first process composition is introduced to the plasma processing system, wherein the first process composition comprises $SF_6$ and a fluorocarbon gas. Alternately, the first process composition can further comprise an inert gas, such as a noble gas.

In 420, a plasma is formed in the plasma processing system from the first process composition using, for example, any of the systems described in FIGS. 2 through 6, or combinations thereof.

In 430, the substrate comprising the doped silicon layer is exposed to the plasma formed in 420 in order to etch through the doped silicon layer.

Optionally, in 440, a second process composition is introduced to the plasma processing system, wherein the second process composition comprises a halogen containing gas. Alternately, the second process composition can further comprise an inert gas, such as a noble gas.

Optionally, in 450, a plasma is formed in the plasma processing system from the second process composition using, for example, any of the systems described in FIGS. 2 through 6, or combinations thereof.

Optionally, in 460, the substrate is exposed to the plasma formed in 450 in order to etch through the remaining undoped silicon layer.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of etching a silicon layer on a substrate, comprising:
    disposing said substrate having said silicon layer in a plasma processing system, wherein said silicon layer comprises:
        a first sub-layer having a dopant and occupying a first fraction of the thickness of said silicon layer, and
        a second undoped sub-layer occupying the remaining fraction of the thickness of said silicon layer, said first sub-layer disposed over said second sub-layer, a dopant concentration in said silicon layer changing abruptly between said first sub-layer and said second sub-layer;
    introducing a first process composition comprising $SF_6$ and a fluorocarbon gas to said plasma processing system;
    forming a first plasma from said first process composition in said plasma processing system;
    exposing said substrate to said first plasma during a first time period sufficient to etch said first sub-layer;
    introducing a second process composition comprising a halogen containing gas to said plasma processing system, said second process composition being different from said first process composition;
    forming a second plasma from said second process composition in said plasma processing system; and
    exposing said substrate to said second plasma during a second time period, following said first time period, sufficient to etch said second sub-layer.

2. The method of claim 1, wherein said introducing of said first process composition further comprises introducing an inert gas.

3. The method of claim 2, wherein said introducing of said inert gas comprises introducing a noble gas.

4. The method of claim 1, wherein said introducing of said fluorocarbon gas comprises introducing a composition including $C_xF_y$, wherein x and y are integers greater than or equal to unity.

5. The method of claim 4, wherein said introducing of said fluorocarbon gas comprises introducing $C_4F_8$, $C_5F_8$, $C_3F_6$, or $C_4F_6$, or any combination of two or more thereof.

6. The method of claim 1, wherein said introducing of said fluorocarbon gas comprises introducing a composition including $CH_xF_y$, wherein x and y are integers greater than or equal to unity.

7. The method of claim 1, wherein said introducing of said second process composition comprises introducing $SF_6$, HBr, or $Cl_2$, or any combination of two or more thereof.

8. The method of claim 1, wherein said introducing of said second process composition further comprises introducing an inert gas.

9. The method of claim 8, wherein said introducing of said inert gas comprises introducing a noble gas.

10. The method of claim 1, wherein said exposing of said substrate to said first plasma and exposing of said substrate to said second plasma facilitates formation of a feature in said silicon layer by transferring a pattern formed in an etching mask overlying said silicon layer to said silicon layer.

11. The method of claim 10, wherein said etching mask comprises an initial critical dimension prior to said exposing of said substrate to said first plasma and said exposing of said substrate to said second plasma and said silicon layer comprises a final critical dimension following said exposing of said substrate to said first plasma and said exposing of said substrate to said second plasma, and wherein a trim amount is equivalent to a difference between said initial critical dimension and said final critical dimension.

12. The method of claim 11, wherein a first feature condition on said substrate comprises one or more widely spaced features corresponding to a first trim amount and a second feature condition on said substrate comprises a plurality of closely spaced features corresponding to a second trim amount, and wherein a difference between said first trim amount and said second trim amount is equivalent to approximately 10% of said initial critical dimension or less.

13. The method of claim 1, wherein said forming of said first plasma comprises coupling radio frequency (RE) power to a substrate holder upon which said substrate rests.

14. The method of claim 1, wherein said forming of said first plasma comprises coupling radio frequency (RE) power to an electrode positioned opposite a substrate holder upon which said substrate rests.

15. The method of claim 1, wherein said dopant comprises phosphorus, boron, or arsenic, or any combination of two or more thereof.

16. A computer readable medium containing program instructions for execution on a computer system, which when executed by the computer system, cause the computer system to control a plasma processing system to perform the steps of:

disposing a substrate having a silicon layer in the plasma processing system, wherein said silicon layer comprises:

a first sub-layer having a dopant and occupying a first fraction of the thickness of said silicon layer, and a second undoned sub-layer occupying the remaining fraction of the thickness of said silicon layer, said first sub-layer disposed over said second sub-layer, a dopant concentration in said silicon layer changing abruptly between said first sub-layer and said second sub-layer;

introducing a first process composition comprising $SF_6$ and a fluorocarbon gas to said plasma processing system;

forming a first plasma from said process composition in said plasma processing system;

exposing said substrate to said first plasma during a first time period sufficient to etch said first sub-layer;

introducing a second process composition comprising a halogen containing gas to said plasma processing system, said second process composition being different from said first process composition;

forming a second plasma from said second process composition in said plasma processing system; and exposing said substrate to said second plasma during a second time period, following said first time period, sufficient to etch said second sub-layer.

* * * * *